(12) United States Patent
Fiedler

(10) Patent No.: US 7,813,460 B2
(45) Date of Patent: Oct. 12, 2010

(54) HIGH-SPEED DATA SAMPLER WITH INPUT THRESHOLD ADJUSTMENT

(75) Inventor: Alan Fiedler, Mountain View, CA (US)

(73) Assignee: SLT Logic, LLC, Boston, MA (US)

( * ) Notice: Subject to any disclaimer, the term of this patent is extended or adjusted under 35 U.S.C. 154(b) by 1077 days.

(21) Appl. No.: 11/241,234

(22) Filed: Sep. 30, 2005

(65) Prior Publication Data

US 2007/0205818 A1 Sep. 6, 2007

(51) Int. Cl.
*H04L 7/00* (2006.01)
*H03L 7/00* (2006.01)
*H04J 3/06* (2006.01)
*H04J 3/07* (2006.01)

(52) U.S. Cl. .................. 375/355; 375/354; 714/12; 713/375; 709/248; 704/270.1; 370/503; 370/504; 370/505; 370/506; 327/141; 327/142; 327/144; 327/155

(58) Field of Classification Search .............. 327/57, 327/91, 97; 375/355
See application file for complete search history.

(56) References Cited

U.S. PATENT DOCUMENTS

| | | | | |
|---|---|---|---|---|
| 4,080,572 | A | * | 3/1978 | Hastings et al. ............ 375/342 |
| 5,012,247 | A | * | 4/1991 | Dillman ..................... 341/172 |
| 5,659,259 | A | * | 8/1997 | Bodenstab .................. 327/51 |
| 5,970,093 | A |   | 10/1999 | De Lantremange |
| 6,141,378 | A |   | 10/2000 | de Lantremange |
| 6,144,580 | A | * | 11/2000 | Murray .................. 365/185.01 |
| 6,252,441 | B1 |   | 6/2001 | Lee et al. |
| 6,269,131 | B1 | * | 7/2001 | Gothe et al. ................ 375/346 |
| 6,396,329 | B1 |   | 5/2002 | Zerbe |
| 6,538,486 | B1 |   | 3/2003 | Chen et al. |
| 6,549,150 | B1 | * | 4/2003 | Bulaga et al. ............... 341/120 |
| 6,580,763 | B1 |   | 6/2003 | Mullner et al. |
| 6,826,390 | B1 |   | 11/2004 | Tamura |
| 6,850,580 | B1 |   | 2/2005 | Naoe |
| 6,882,208 | B1 |   | 4/2005 | Suissa et al. |
| 6,943,500 | B2 | * | 9/2005 | LeChevalier ............ 315/169.3 |
| 6,965,262 | B2 |   | 11/2005 | Zerbe |
| 6,993,695 | B2 |   | 1/2006 | Rivoir |
| 7,126,510 | B2 |   | 10/2006 | Alon et al. |
| 7,209,525 | B2 |   | 4/2007 | Laturell et al. |
| 7,233,164 | B2 | * | 6/2007 | Stojanovic et al. ............ 326/22 |
| 7,715,509 | B2 | * | 5/2010 | Stojanovic et al. .......... 375/355 |
| 2002/0153936 | A1 |   | 10/2002 | Zerbe |

(Continued)

OTHER PUBLICATIONS

Stojanovic, "Adaptive Equalization and Data Recovery in a Dual-Mode (PAM2/4) Serial Link Transceiver," IEEE Symposium on VLSI Circuits, Jun. 2004.

(Continued)

*Primary Examiner*—Shuwang Liu
*Assistant Examiner*—Gina McKie
(74) *Attorney, Agent, or Firm*—Patterson Thuente Christensen Pedersen, PA

(57) ABSTRACT

Method and apparatus for sampling a high-speed digital signal include providing a data signal to a differential data input circuit, an offset control signal, and a strobe pulse. In response to the strobe pulse, the data signal is resolved into an output logic state based to a relatively greater extent on the differential data signal and to a relatively lesser extent on the offset control signal.

2 Claims, 3 Drawing Sheets

U.S. PATENT DOCUMENTS

| | | | |
|---|---|---|---|
| 2002/0184564 A1 | 12/2002 | Muellner | |
| 2003/0118138 A1* | 6/2003 | Chow et al. | 375/355 |
| 2004/0022311 A1* | 2/2004 | Zerbe et al. | 375/229 |
| 2004/0091073 A1 | 5/2004 | Smith et al. | |
| 2004/0120426 A1 | 6/2004 | Dagdeviren et al. | |
| 2004/0202266 A1 | 10/2004 | Gregorius et al. | |
| 2004/0203559 A1* | 10/2004 | Stojanovic et al. | 455/403 |
| 2004/0218693 A1* | 11/2004 | Hickling | 375/316 |
| 2005/0033902 A1 | 2/2005 | Tamura | |
| 2005/0040864 A1 | 2/2005 | Fricken et al. | |
| 2005/0058234 A1 | 3/2005 | Stojanovic | |
| 2005/0105591 A1* | 5/2005 | Egan | 375/130 |
| 2005/0105592 A1* | 5/2005 | Egan et al. | 375/130 |
| 2005/0265487 A1* | 12/2005 | Sou | 375/326 |
| 2006/0061405 A1 | 3/2006 | Zerbe | |
| 2006/0188043 A1 | 8/2006 | Zerbe et al. | |
| 2006/0253746 A1 | 11/2006 | Momtaz | |
| 2007/0230513 A1* | 10/2007 | Talbot et al. | 370/516 |

OTHER PUBLICATIONS

Stojanovic, "Autonomous Dual-Mode (PAM2/4) Serial Link Transceiver with Adaptive Equalization and Data Recovery," IEEE Journal of Solid-State Circuits, Apr. 2005.

Application and File History of U.S. Appl. No. 11/173,226, filed Jul. 1, 2005, now U.S. Patent No. 7,573,967, issued Aug. 11, 2009, Inventor Fiedler, at www.uspto.gov.

* cited by examiner

HIGH-SPEED DATA SAMPLER WITH INPUT THRESHOLD ADJUSTMENT

THE FIELD OF THE INVENTION

The present invention generally relates to integrated circuits, and more particularly to data samplers and data sampling circuits, and circuits for adjusting the input threshold of data sampling circuits, especially at high speeds such as rates above 0.10 Gb/s.

BACKGROUND OF THE INVENTION

Certain methods of receiving high speed data signals involve sampling an incoming data stream and determining the logic state of each symbol period of the incoming signal. Based on the determined logic state, the data stream is re-generated locally for further processing. The process of determining and re-generating the sampled logic state is known in the art as resolving the logic state. The process of sampling and resolving the data takes an increasingly significant amount of time as the data transmission rates increase. At rates above 10 Gb/s, the sampling and re-generating time becomes a bottleneck, and a solution for improving the data resolving time is needed.

Various solutions have been proposed to address the issues associated with high speed data sampling as described, for example, in U.S. Pat. Nos. 6,252,441, 6,538,486, 6,580,763, 6,850,580 and U.S. Publication Application Nos. 2002/0184564A1 and 2003/0118138A1.

One problem associated with receiving high data rates is the difficulty with accurately resolving the received data. Lower signal voltages are preferred for high-speed data transmission to reduce the time needed to transition the signaling from one logic state to another. However, signal receiving circuits can exhibit a substantial input offset voltage that directly limits the minimum input signal level that can be successfully resolved by the sampling circuit. A solution is therefore needed for improving the receiving circuitry's ability to resolve signals having a low amplitude that approaches the input offset voltage of the receiver circuitry.

SUMMARY OF THE INVENTION

A data sampling system according to one aspect of the invention includes a strobe-type sampling/resolving circuit having a data input for accepting a data signal that effects a resolution of a logic state to a relatively greater extent. The sampling/resolving circuit also has an offset input for accepting an offset, threshold, weighting, or balancing signal that effects the resolution of the logic state to a relatively lesser extent. In one embodiment, the sampling/resolving circuit includes an offset control circuit for supplying the weighting signal to the weighting input. In another embodiment, the control circuit is adapted to generate the offset signal based on an expectation of a future data signal value.

A method of sampling a high-speed digital signal according to another aspect of the invention includes providing a data signal to a differential data input circuit, an offset control signal, and a strobe pulse. In response to the strobe pulse, the data signal is resolved into an output logic state based to a relatively greater extent on the differential data signal and to a relatively lesser extent on the offset control signal.

Optionally, the offset control signal can be adapted to resolve the data signal into an output logic state at a relatively faster rate when a first polarity of the data signal coincides with a first polarity of the offset control signal during a transition of the strobe pulse; and resolve the data signal into an output logic state at a relatively slower rate when the first polarity of the data signal coincides with a second (opposite) polarity of the offset control signal during the transition of the strobe pulse. This embodiment improves the receiving circuit's bandwidth.

A data sampler circuit for resolving and holding a data signal according to another aspect of the invention includes a first latch circuit that has a latching output for holding a logic state; a clock input electrically coupled to the latch for receiving a clocking signal; and a primary data input electrically coupled to the latch for receiving the data signal to be sampled in response to a transition of a clocking signal appearing at the clock input. A secondary threshold control input electrically coupled to the latch for receiving a threshold signal that selectively adjusts a preference of the first latch circuit for resolving the data signal appearing at the primary data input to a selectable logic state. The latch circuit is adapted to resolve the data signal into one of at least two logic states based in part on the threshold signal in response to a clocking signal transition. The threshold signal can be used to reduce the circuit's effective input offset, and to assist in driving the sampling latch's output more quickly to a fully resolved state.

DESCRIPTION OF THE PREFERRED EMBODIMENTS

Figure 1:
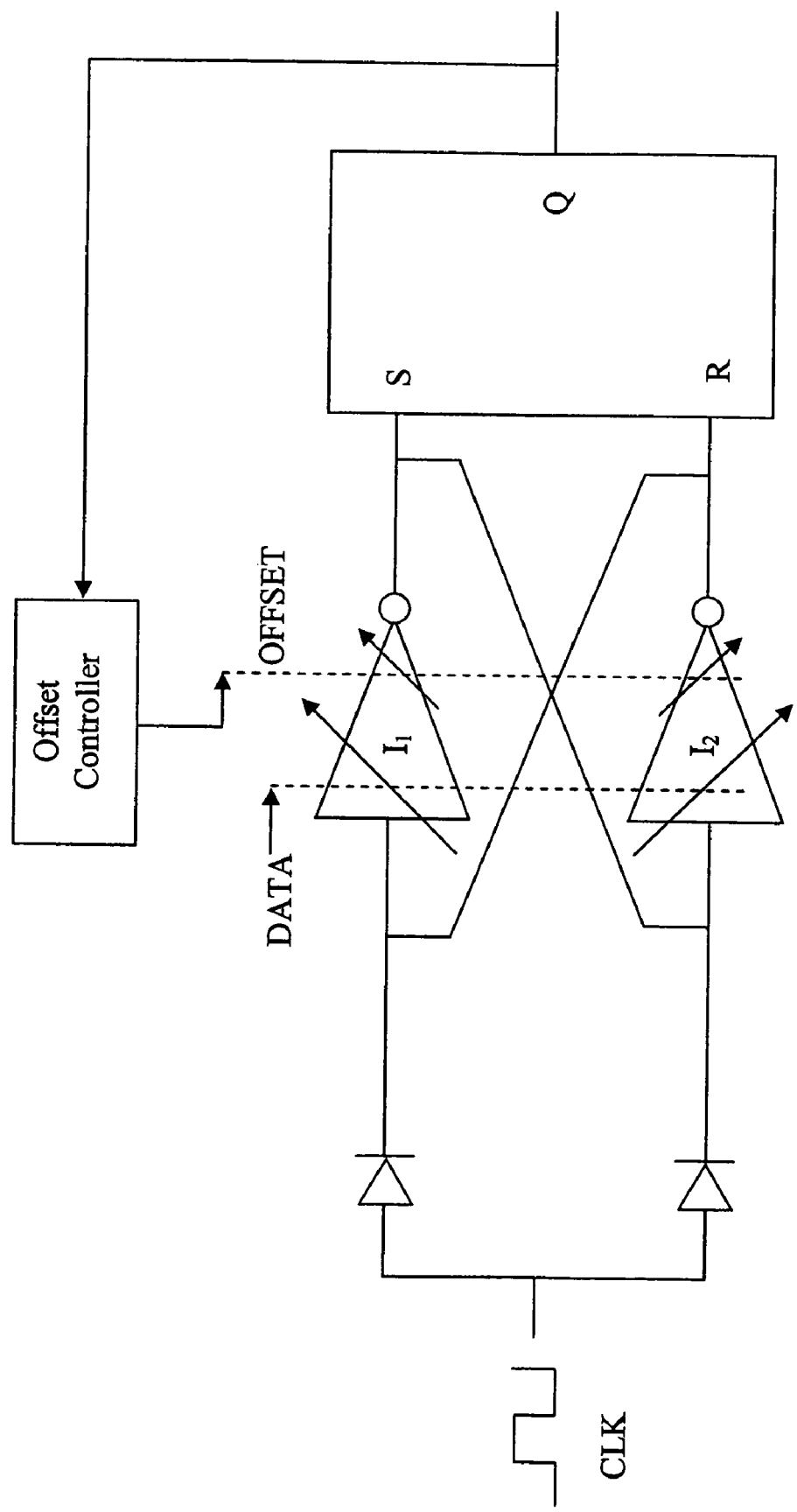
FIG. 1 is a functional block diagram illustrating an example data sampling/resolution arrangement according to one aspect of the invention.

One aspect of the present invention provides a circuit for adjusting the input threshold voltage of a data sampling circuit used in systems such as those used for high-speed networking, A/D converters, or for clock and data recovery. FIG. 1 is a simplified diagram illustrating an example data latch having two sets of inputs that affect the resolving of data. The data latch includes a first stage latch and a second stage latch. The first stage latch is a strobe-type latch having a matched pair of cross-coupled inverting gates $I_1$ and $I_2$. Although inverting gates $I_1$ and $I_2$ are depicted in FIG. 1 as inverters, persons skilled in the art will recognize that any suitable type of circuit can be substituted within the spirit of the invention including, but not limited to, NAND gates, NOR gates, and the like. The second stage latch is an RS-type latch.

When the clocking signal CLK is low, the first stage latch of FIG. 1 maintains a latched state using the positive feedback of the cross-coupling. When the clocking signal CLK is high, the inputs and outputs of each inverting gate $I_1$ and $I_2$ are forced high, and the latch is in a reset state. On transition of the clock CLK from high to low, the first stage latch enters into one of two logic states. In operation, the DATA input affects the balance $I_1$ and $I_2$. Thus, on a high-to-low transition of CLK, the latch will enter a state determined by the signal at the DATA input. In one sense, the DATA input affects the first stage latch's tendency to favor resolving one logic state or another, based on the signal at the DATA input. Because the inverting gates $I_1$ and $I_2$ are ideally balanced with respect to one another, absent any additional signaling causing any particular state to be favored, the first stage latch will ideally enter into either latched state with a 50% probability.

Practically, however, $I_1$ and $I_2$ are not ideally matched, and an inherent offset will exist. Thus, when receiving DATA signaling that is at a low amplitude, the first stage latch will tend to favor resolving one logic state over the other, resulting in sampling errors. To manage this input offset, the first stage latch of FIG. 1 further includes an OFFSET adjustment input. Similar to the DATA input, the OFFSET adjustment also affects the first stage latch's tendency to favor one logic state over another. Preferably, the OFFSET adjustment is less sensitive than the DATA input. The OFFSET adjustment can be thought of as a threshold adjustment, a weighting adjustment, or a balance adjustment. In one example system, the OFFSET input is coupled to an offset controller, as illustrated in FIG. 1. In one embodiment, the offset controller is a circuit adapted to generate a dynamic offset signal to improve or optimize the operation of the latch.

In one embodiment, the first stage latch includes two cross-coupled CMOS inverters. The first stage latch is first reset to a balanced state when an input clock is low. On the transition of the input clock from low to high, the first stage latch is enabled and, through positive feedback, latches into one of two possible states. The voltage of a primary differential data input at the time of the rising clock input for the most part determines which of the two states is resolved. A secondary threshold control input, operating in parallel with the primary input, is used to adjust the effective input threshold of the primary data input.

The secondary threshold control input can facilitate in driving the first stage latch's output more quickly to a fully resolved state, even in the presence of a changing data input level following the rising edge of the input clock and before the sampling latch has reached its final state.

The second stage latch at the output of the first stage latch converts the data of the first stage latch, valid for less than ½ a clock cycle, into data which is valid for the entire clock cycle and is updated only on the rising edge of the input clock.

Another aspect of the invention involves resetting the first stage latch to a first initial state such that it will reach a fully resolved second state in a shorter period of time, increasing the effective input bandwidth of the sampling latch and also increasing its maximum operating frequency. In one such embodiment, the threshold is adjusted based on an expected future data transition appearing at the DATA input. The expectation of a future data transition can, in turn, be based on the previously-resolved bit. Such a scheme of anticipating a change in data symbol from one symbol to the next can reduce the data resolving time.

Anticipating a future data bit based on a past data bit can even improve the sampling accuracy of the latch. For example, in Manchester-encoded data transmissions, each bit is represented by either a high-to-low transition or a low-to-high transition. Thus, for any given symbol, the probability that the next symbol will be the opposite bit is 75%. In one embodiment, the offset controller is configured to supply an OFFSET signal that causes the first stage latch to favor resolving an opposite symbol from the previously-resolved symbol. For example, assuming a 1 has been resolved, the offset controller will generate an OFFSET signal that will favor the latch's resolving a 0 as the subsequent bit.

Figure 2:
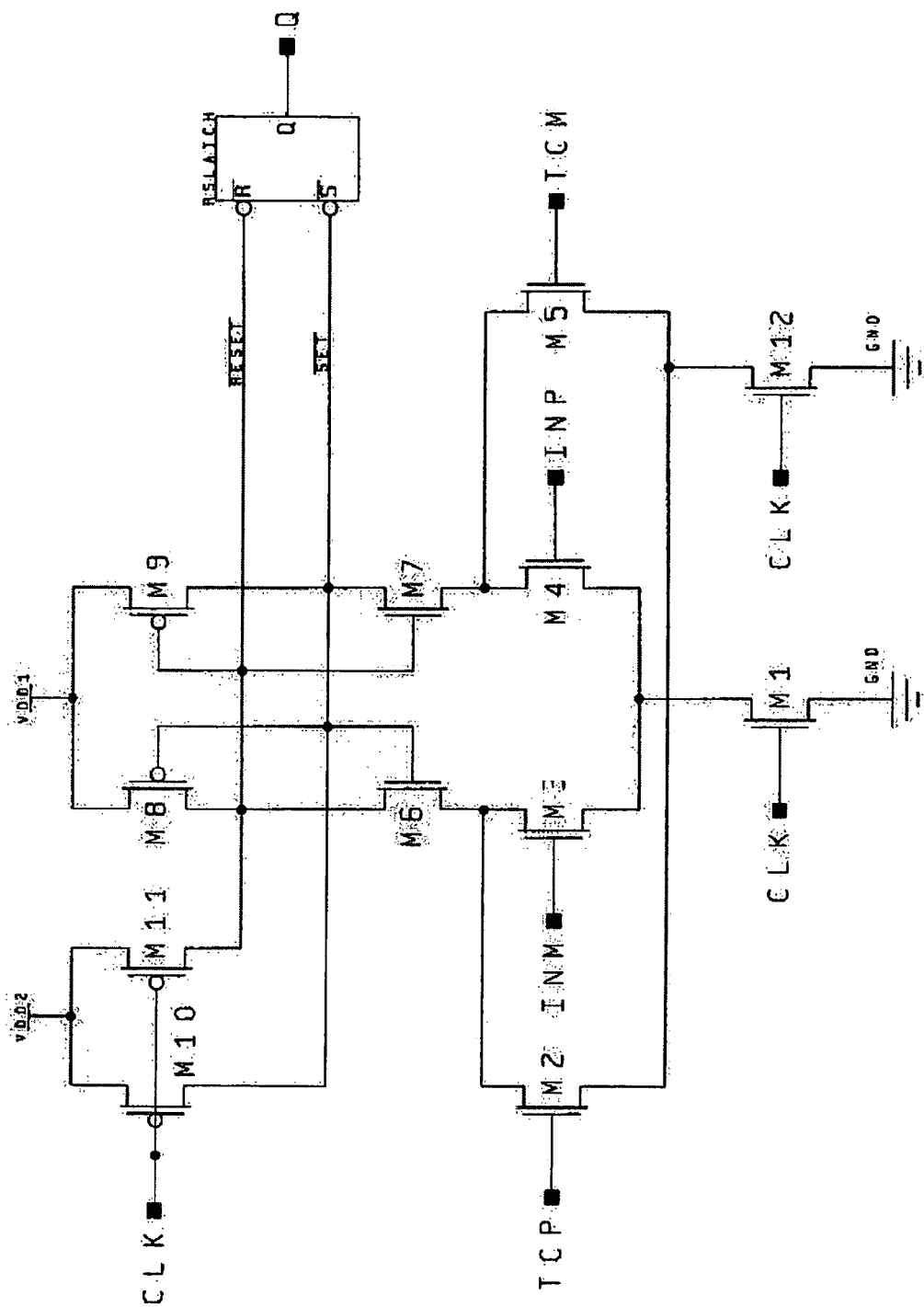
FIG. 2 is a circuit diagram illustrating an exemplary transistor-level embodiment according to one aspect of the invention.

FIG. 2 illustrates one embodiment of the invention that includes an edge-triggered sampler with offset or threshold control. When the clock (CLK) input is a logic low, the first-stage latch, comprising MI-M12, is reset to a balanced state, with /RESET and /SET pulled high to a supply voltage VDD2. This supply voltage is preferably lower in voltage than VDD, and can be generated on-chip by any suitable biasing circuit (not shown).

On a transition of CLK from a logic low to a logic high, different currents are conducted through M6 and M7, depending on the relative voltages INP and INM and the relative voltages TCP (threshold control plus) and TCM (threshold control minus). If more current is conducted through M7 than through M6, /SET falls faster than /RESET, and the positive feedback generated by the cross-coupled devices M6-M9 will eventually force /SET to a logic low and /RESET to a logic high. The relative voltage of threshold control inputs TCP and TCM influences the threshold voltage of the primary differential inputs INP and INM. When TCP is more positive than TCM when CLK transitions from a logic low to a logic high, the latch will preferentially enter a "0" state (with /RESET low and /SET high) if the voltage of primary differential inputs INP and INM are equal, and for the latch to enter a "1" state (with /SET low and /RESET high), the voltage at INP must be substantially higher than the voltage at INM. In this way, the input threshold of primary differential inputs INP and INM is raised by applying a more positive voltage to TCP, relative to TCM. The RS latch at the output of the first stage latch operates as a second stage latch that receives the data of the first stage latch, which is valid for less than ½ clock cycle, and latches the data for the entire clock cycle. The second stage latch is updated only on the rising edge of the input clock CLK.

Figure 3:
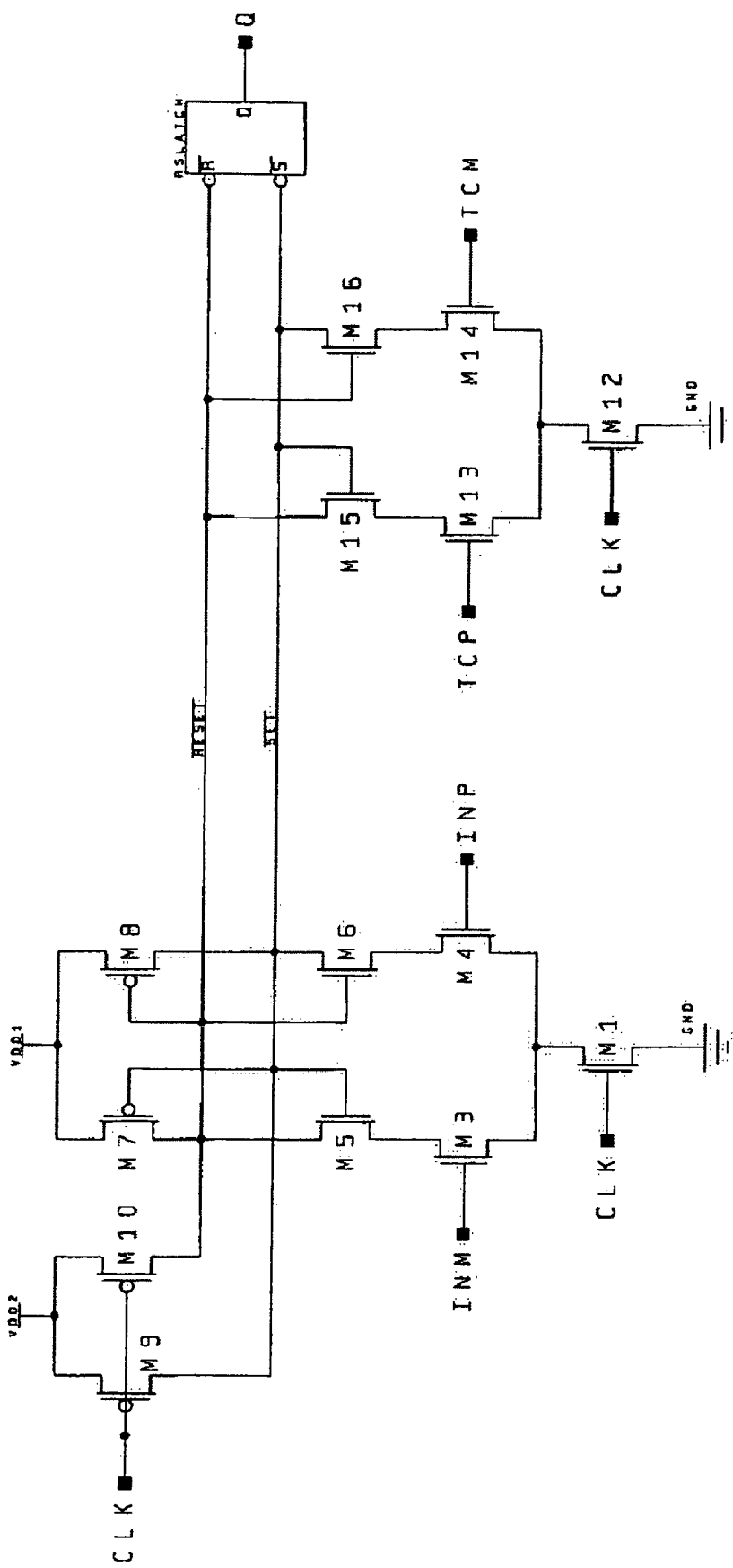
FIG. 3 is a circuit diagram illustrating an alternative topology for achieving the function the arrangement of FIG. 2. Persons skilled in the art will appreciate that any number of variations in circuit topology are within the spirit and scope of the invention.

FIG. 3 illustrates an alternative embodiment of the edge-triggered sampler with offset or threshold control. The first stage latch circuit consisting of transistors M1-M10 operates as described above with respect to FIG. 2. The threshold or offset control circuit, consisting of transistors M12-M16; however, operates according to a different mechanism. In particular, the differential threshold control signal applied across TCP and TCM affects the degree of turn-on of weighting control transistors M15 and M16. Weighting control transistors M15 and M16 affect the symmetry of the cross-coupled inverters M5/M7 and M6/M8 such that, following a reset CLK pulse, the first stage latch tends to favor one side or the other. In a preferred embodiment, the weighting control transistors M15 and M16 affect the balance of the first stage latch to a lesser extent than do primary input transistors M3 and M4.

Although specific embodiments have been illustrated and/or described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the relevant arts will readily appreciate that the present invention may be implemented in a very wide variety of embodiments. This application is intended to cover any adaptations or variations of the preferred embodiments discussed herein.

The invention claimed is:

1. A data sampling system for resolving a high speed data signal, comprising:
   a circuit that samples and resolves the high speed data signal in response to a strobe signal, including:
      input means for accepting the high speed data signal and affecting a resolution of a logic state of the high speed data signal;
      offset input means for accepting an offset signal and affecting the resolution of the logic state of the high speed data signal to a lesser extent than the input means affects the resolution; and offset control means for generating the offset signal based on an expectation of a future value of the high speed data signal, wherein the offset control means is adapted to generate an offset signal that causes the circuit to favor resolving to a logic state that is an inverse of the most recently resolved logic state.

2. A data sampling system for resolving a high speed data signal, comprising:

a circuit that samples and resolves the high speed data signal in response to a strobe signal, including:

input means for accepting the high speed data signal and affecting a resolution of a logic state of the high speed data signal;

offset input means for accepting an offset signal and affecting the resolution of the logic state of the high speed data signal to a lesser extent than the input means affects the resolution; and offset control means for generating the offset signal based on an expectation of a future value of the high speed data signal, wherein the offset signal affects a rate of the resolution of the logic state such that an offset signal tending to favor resolution of a first logic value causes the circuit to output the first logic value more rapidly than without the offset signal.

* * * * *